(12) United States Patent
Cucci et al.

(10) Patent No.: US 11,764,258 B2
(45) Date of Patent: Sep. 19, 2023

(54) AIRGAP ISOLATION STRUCTURES

(71) Applicant: GLOBALFOUNDRIES U.S. Inc., Santa Clara, CA (US)

(72) Inventors: Brett T. Cucci, Colchester, VT (US); Siva P. Adusumilli, South Burlington, VT (US); Johnatan A. Kantarovsky, South Burlington, VT (US); Claire E. Kardos, Essex Junction, VT (US); Sen Liu, Piscataway, NJ (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 227 days.

(21) Appl. No.: 17/108,543

(22) Filed: Dec. 1, 2020

(65) Prior Publication Data

US 2022/0173211 A1   Jun. 2, 2022

(51) Int. Cl.
*H01L 29/06*  (2006.01)
*H01L 21/768*  (2006.01)
*H01L 21/764*  (2006.01)

(52) U.S. Cl.
CPC ........ *H01L 29/0649* (2013.01); *H01L 21/764* (2013.01); *H01L 21/7682* (2013.01)

(58) Field of Classification Search
CPC ............... H01L 21/764; H01L 21/7682; H01L 29/0649; H01L 21/823481; H01L 21/76283; H01L 29/6659; H01L 21/76232; H01L 29/0653; H01L 29/7833; H01L 29/778606; H01L 21/84; H01L 21/02532; H01L 27/1203; H01L 29/78654; H01L 29/1095; H01L 21/76224; H01L 29/785; H01L 29/66795; H01L 21/823431; H01L 29/7851; H01L 29/41791; H01L 29/0673; H01L 29/66818; H01L 29/42392; H01L 21/02636; H01L 29/0688; H01L 29/78; H01L 21/3065; H01L 29/66636; H01L 29/0847; H01L 29/66568; H01L 21/3081; H01L 21/02271; H01L 29/4991; H01L 21/0217; H01L 21/76829; H01L 21/3086; H01L 21/3247; H01L 29/1037; H01L 29/1029; H01L 29/7842; H01L 21/7624; H01L 27/092; H01L 29/78603; H01L 23/10; H01L 21/823807; H01L 21/02293; H01L 27/1218; H01L 21/324; H01L 23/48; H01L 21/76898; H01L 21/76229; H01L 27/1207; H01L 29/78606; H01L 29/7841; H01L 21/76286; H01L 29/165;
(Continued)

(56) References Cited

U.S. PATENT DOCUMENTS 4,710,794 A * 12/1987 Koshino ............... H01L 21/764
257/501
6,406,975 B1    7/2002 Lim et al.
(Continued)

*Primary Examiner* — Mouloucoulaye Inoussa
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to airgap isolation structures and methods of manufacture. The structure includes: a bulk substrate material; a first airgap isolation structure in the bulk substrate material and having a first aspect ratio; and a second airgap isolation structure in the bulk substrate material and having a second aspect ratio different from the first aspect ratio.

20 Claims, 5 Drawing Sheets

(58) Field of Classification Search
CPC ............... H01L 29/665; H01L 29/515; H01L 21/02164; H01L 21/26533; H01L 21/02236; H01L 21/76267; H01L 21/02255; H01L 29/06; G02B 6/122; G02B 6/136; G02B 6/1347; G02B 6/12004
USPC ....... 257/501, 526, 647, 502, 622, 522, 392, 257/415, 510, 2 E, 21.608, 21.56, 21.088, 257/21.564, 21.69, 27.031, 29.007, 257/21.546, 21.003; 438/296, 381, 424
See application file for complete search history.

(56) References Cited

U.S. PATENT DOCUMENTS

| | | | |
|---|---|---|---|
| 7,015,116 B1 | 3/2006 | Lo et al. | |
| 7,622,778 B2 | 11/2009 | Lee et al. | |
| 8,395,217 B1* | 3/2013 | Cheng | H01L 21/76289 438/222 |
| 9,368,608 B1* | 6/2016 | Camillo-Castillo | H01L 29/7371 |
| 9,922,973 B1* | 3/2018 | Shank | H01L 29/1083 |
| 10,192,779 B1* | 1/2019 | Shank | H01L 29/0649 |
| 10,224,396 B1* | 3/2019 | Shank | H01L 29/78 |
| 10,388,728 B1* | 8/2019 | Zierak | H01L 29/0649 |
| 10,446,643 B2 | 10/2019 | Stamper et al. | |
| 10,461,152 B2 | 10/2019 | Adusumilli et al. | |
| 2002/0132448 A1 | 9/2002 | Lim et al. | |
| 2004/0048444 A1 | 3/2004 | Seo | |
| 2010/0314668 A1* | 12/2010 | Ollier | B81C 1/00246 257/E23.18 |
| 2011/0018091 A1* | 1/2011 | Barth | H01L 23/5256 257/E23.149 |
| 2012/0038024 A1* | 2/2012 | Botula | H01L 21/76289 257/E21.546 |
| 2012/0306049 A1* | 12/2012 | Booth, Jr. | H01L 28/60 257/532 |
| 2013/0193531 A1* | 8/2013 | Nishikawa | H01L 29/84 257/415 |
| 2013/0320459 A1* | 12/2013 | Shue | H01L 21/76283 438/296 |
| 2015/0001671 A1* | 1/2015 | In 'T Zandt | H01L 21/74 438/444 |
| 2015/0340273 A1* | 11/2015 | Jaffe | G02B 6/122 438/433 |
| 2016/0064475 A1* | 3/2016 | Feilchenfeld | H01L 21/76224 257/491 |
| 2016/0071925 A1* | 3/2016 | Jaffe | H01L 29/66757 438/295 |
| 2018/0083128 A1* | 3/2018 | Yokoyama | H01L 29/1095 |
| 2018/0108675 A1* | 4/2018 | Schmidt | H01L 21/84 |
| 2019/0081138 A1* | 3/2019 | Liu | H01L 29/78606 |
| 2019/0157407 A1* | 5/2019 | Singh | H01L 27/0924 |
| 2019/0229184 A1* | 7/2019 | Shank | H01L 21/02636 |
| 2019/0229185 A1* | 7/2019 | Adusumilli | H01L 29/0653 |
| 2019/0312142 A1* | 10/2019 | Adusumilli | H01L 21/3247 |
| 2020/0144369 A1* | 5/2020 | Lin | H01L 27/1203 |
| 2020/0343127 A1* | 10/2020 | Wann | H01L 21/76283 |
| 2020/0343373 A1* | 10/2020 | Tsai | H01L 21/76224 |
| 2021/0091213 A1* | 3/2021 | Jain | H01L 29/0821 |

* cited by examiner

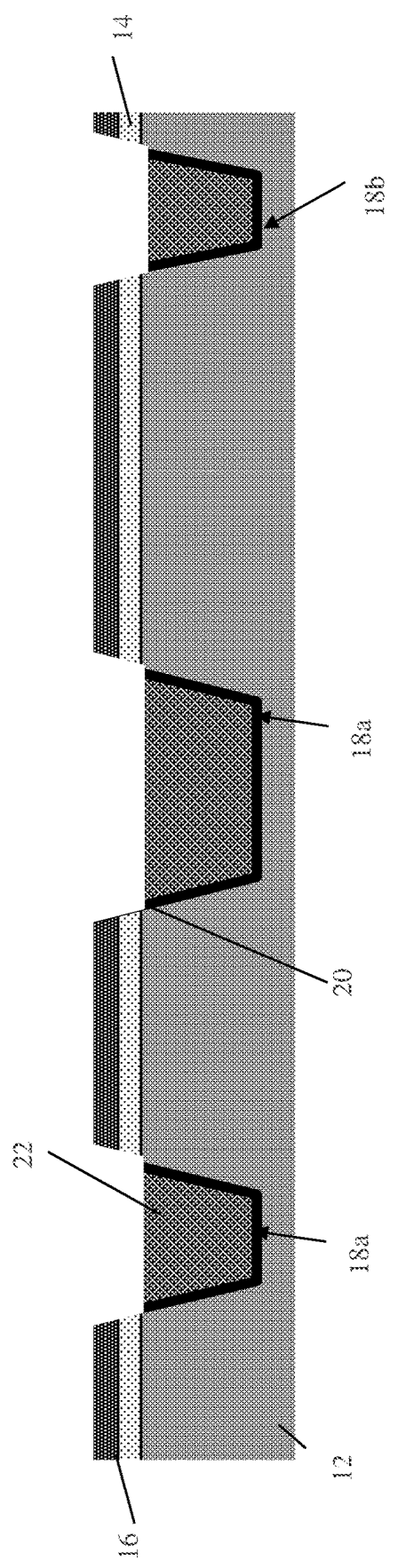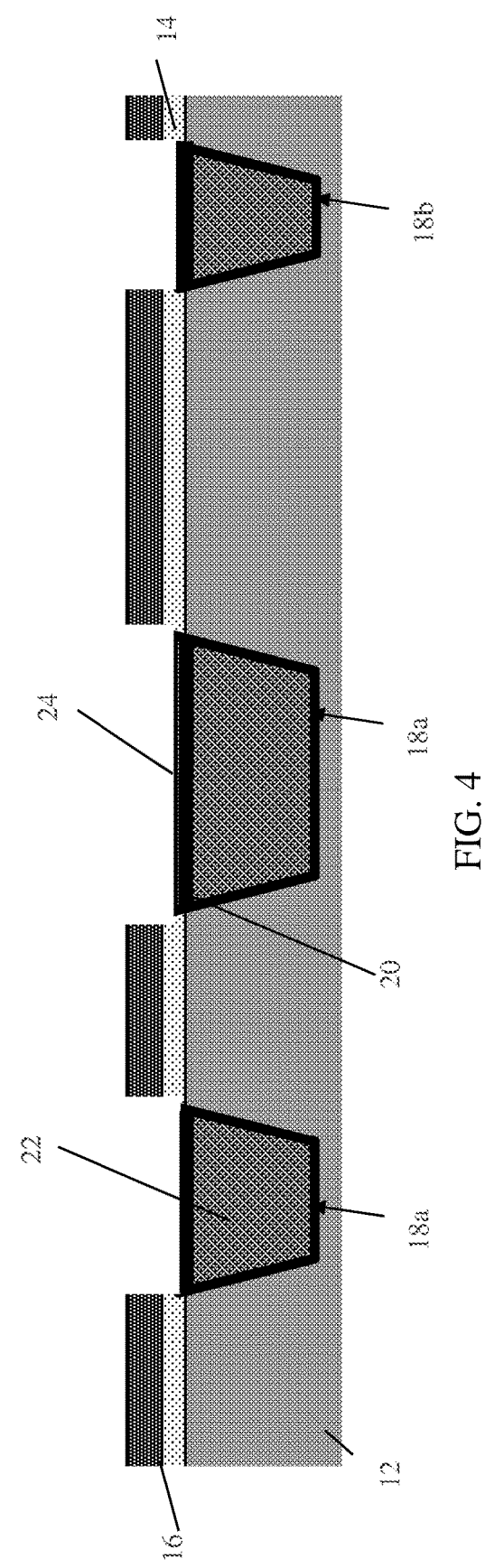

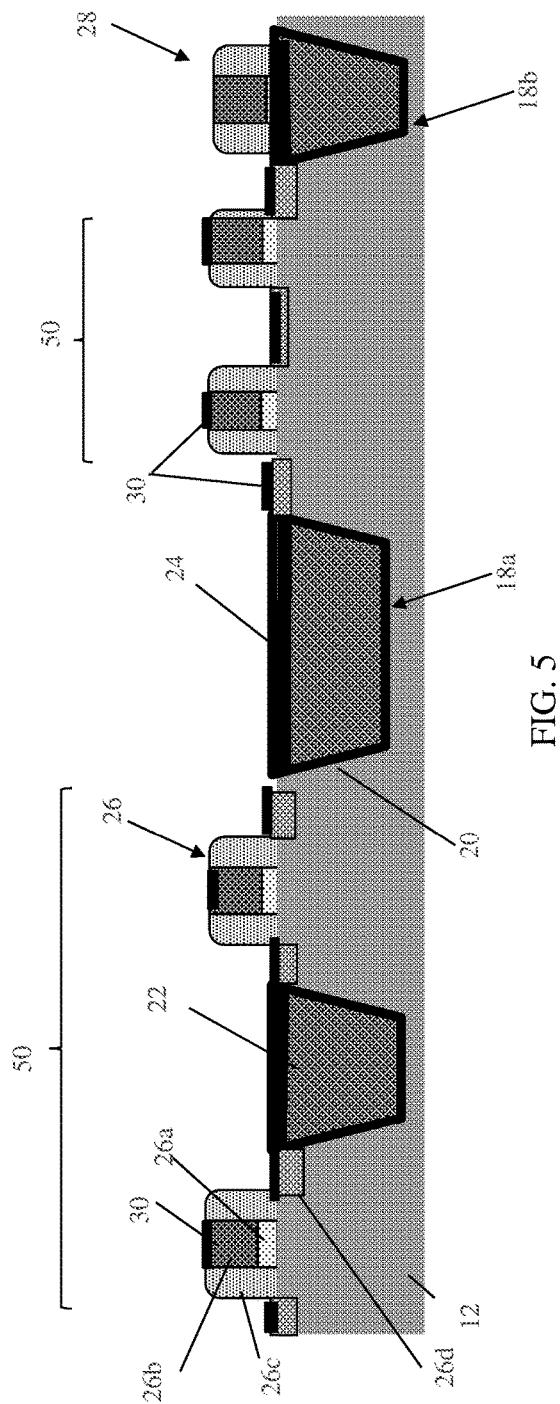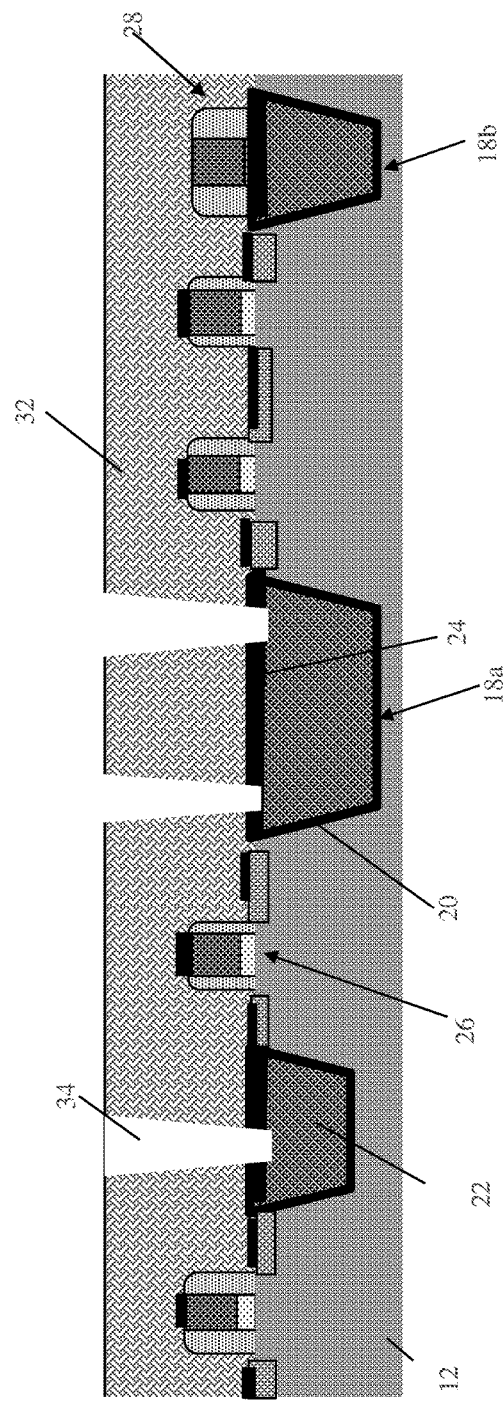

AIRGAP ISOLATION STRUCTURES

FIELD OF THE INVENTION

The present disclosure relates to semiconductor structures and, more particularly, to airgap isolation structures and methods of manufacture.

BACKGROUND

Radio frequency (RF) devices are used in many different types of communication applications. For example, RF devices can be used in cellular telephones with wireless communication components such as switches, MOSFETs, transistors and diodes. Currently, there is an increasing need to provide higher performance and lower price points for the wireless communication components. A significant fraction of the cost of manufacturing a RF switch, for example, is the cost to engineer very high linearity such that harmonic distortion is extremely low and meets product specifications.

RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises: a bulk substrate material; a first airgap isolation structure in the bulk substrate material and comprising a first aspect ratio; and a second airgap isolation structure in the bulk substrate material and comprising a second aspect ratio different from the first aspect ratio.

In an aspect of the disclosure, a structure comprises: a bulk substrate material; at least one airgap isolation structure in the bulk substrate material; a first insulator material on all surfaces of the at least one airgap isolation structure; and a second insulator material plugging at least one opening in the first insulator material and sealing the at least one airgap isolation structure.

In an aspect of the disclosure, a structure comprising: a first airgap isolation structure in a semiconductor material, between active devices, the first airgap isolation structure lined on surfaces with an insulator material which includes at least one entry point independent of other patterning of the semiconductor material; a second airgap isolation structure in the semiconductor material, between banks of the active devices, the second airgap isolation structure lined on surfaces with the insulator material which includes multiple entry points independent of the other patterning of the semiconductor material; at least one pillar in the second airgap isolation structure; and a second insulator material that plugs the at least one opening of the first airgap isolation structure and the multiple openings of the second airgap isolation structure.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 3 shows the STI structures filled with a material, amongst other features, and respective fabrication processes in accordance with aspects of the present disclosure.

FIG. 4 shows a liner material over the material in the STI structures, amongst other features, and respective fabrication processes in accordance with aspects of the present disclosure.

FIG. 5 shows active and passive devices, amongst other features, and respective fabrication process in accordance with aspects of the present disclosure.

FIG. 6 shows a masking material with openings that expose material of the STI structures, amongst other features, and respective fabrication process in accordance with aspects of the present disclosure.

DETAILED DESCRIPTION

The present disclosure relates to semiconductor structures and, more particularly, to airgap isolation structures and methods of manufacture. The airgap isolation structures can be used with radio frequency (RF) FETs or NPNs, e.g., FET switches. In embodiments, the airgap isolation structures can be defined by shallow trench isolation (STI) structures (e.g., trenches) throughout a shallow trench isolation region. By using the STI structures, it is now possible to have well-defined airgap isolation structures with a greater air-to-dimensional ratio (compared to known airgap structures), thereby improving RF isolation (e.g., lower capacitance). In addition, the processes and structures described herein reduce or eliminate shallow trench isolation effects which may occur at an interface of oxide and substrate material at a corner of the STI structures.

In embodiments, the airgap isolation structures can be defined by STI structures within a bulk substrate. In this way, it is possible to extend airgaps throughout an entirety of a shallow trench isolation region, leveraging existing contact via films for pinch-off (e.g., leveraging Borophosphosilicate (BPSG) for pinch-off). Also, it is possible to vary the aspect ratios of the STI structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
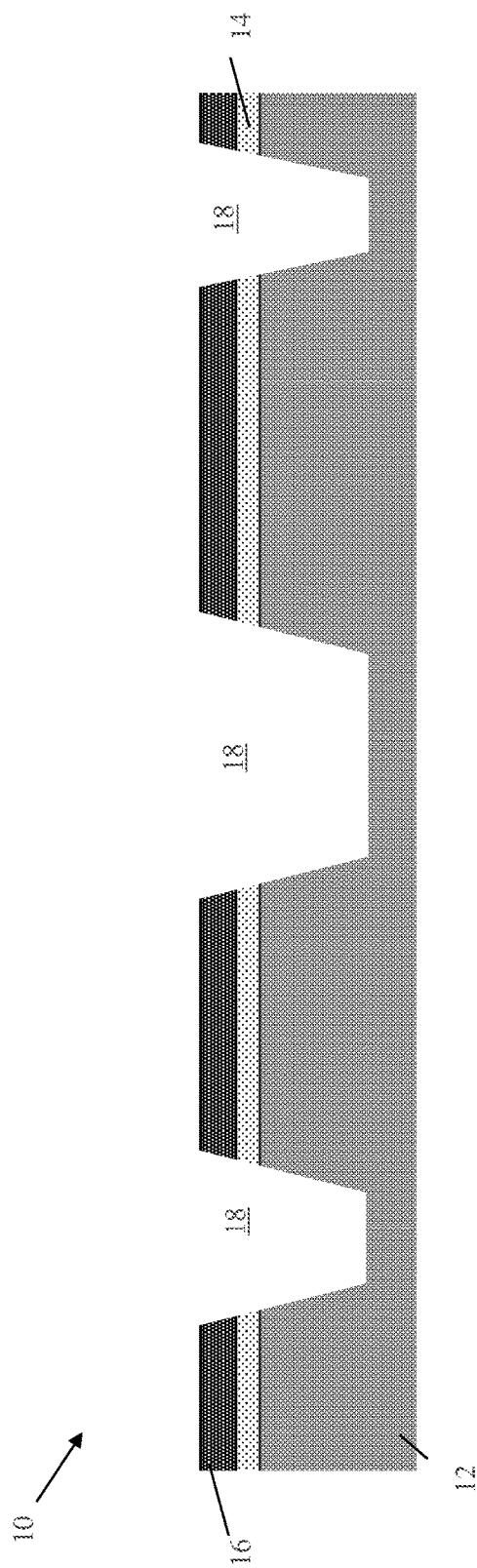
FIG. 1 shows shallow trench isolation (STI) structures, amongst other features, and respective fabrication processes in accordance with aspects of the present disclosure.

FIG. 1 shows STI structures, amongst other features, and respective fabrication processes. More specifically, the structure 10 includes a substrate 12 composed of semiconductor material. In embodiments, the substrate 12 comprises a bulk substrate composed of any suitable semiconductor material including, but not limited to, Si, SiGe, SiGeC, SiC, GaAs, InAs, InP, and other III/V or II/VI compound semiconductors. A plurality of pad films 14, 16 are formed on the substrate 12. For example, the pad films 14, 16 can be a pad oxide film and a pad nitride film formed over the pad oxide film. The pad films 14, 16 can be deposited by conventional deposition methods, e.g., chemical vapor deposition (CVD).

Still referring to FIG. 1, a plurality of STI structures (trenches) 18 are formed in the substrate 12 throughout an STI region (e.g., STI level of the structure). The plurality of STI trenches 18 can have various aspect ratios, depending on the design parameters and placement of devices on the substrate 12. For example, smaller STI trenches 18 can be placed between transistors in a single bank; whereas, larger STI trenches 18 can be placed between the separate banks, themselves. In embodiments, the larger STI trenches 18 can have a diameter of upwards of 200 microns; although other dimensions are contemplated herein. The different aspect ratios of the plurality of STI trenches 18 can be possible due to the fact that they are formed with the STI formation processes, and are not constrained by pinch-off processes used with conventional airgap formation processes, which require narrow trenches to form cavities all of the same dimension.

The plurality of STI trenches 18 are formed by conventional lithography and etching methods known to those of skill in the art. As noted herein, the STI trenches 18 are formed within the STI region, and hence can be formed with any of the other STI structures formed in the substrate, using the same processes. For example, a resist formed over the pad film 16 is exposed to energy (light) to form a pattern (opening). An etching process with a selective chemistry, e.g., reactive ion etching (RIE), will be used to form one or more STI trenches 18 within the substrate 12, through the openings of the resist. The resist can then be removed by a conventional oxygen ashing process or other known stripants.

Figure 2:
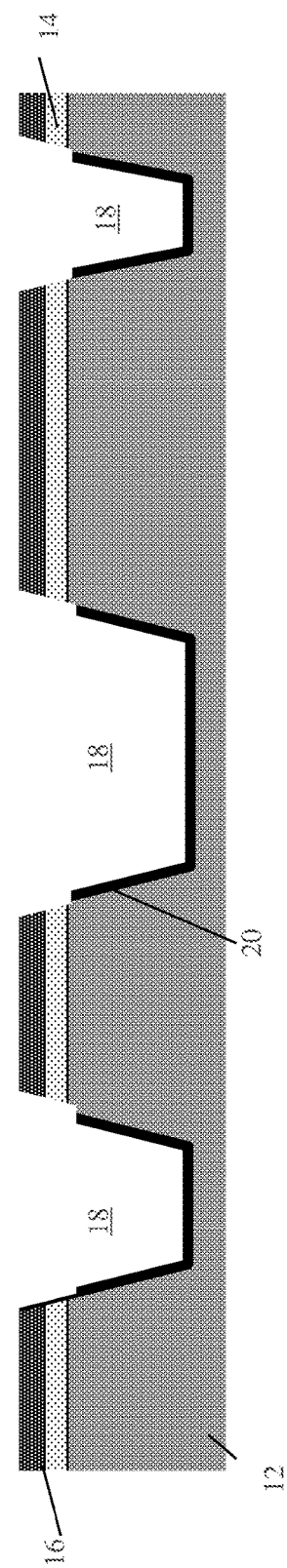
FIG. 2 shows an oxide liner within the STI structures, amongst other features, and respective fabrication processes in accordance with aspects of the present disclosure.

As shown in FIG. 2, an oxide liner 20 can be formed on the exposed substrate 12 within the STI trenches 18. In embodiments, the oxide liner 20 can be formed with a uniform thickness using an oxidation process. The oxidation process can be a thermal oxidation which produces a thin layer of oxide (e.g., $SiO_2$) on the exposed surfaces of the substrate 12. The oxide liner 20 can be robust enough, e.g., of such dimensions and coverage, to withstand erosion during subsequent etching processes with different chemistries as described herein. For example, the oxide liner 20 can have a thickness of about 50 nm; although other dimensions are contemplated herein.

In FIG. 3, the STI trenches 18 are filled with a polysilicon material 22. In embodiments, the polysilicon material 22 can be formed by a deposition process on top of the oxide liner 20. Any residual material on the pad film 16 outside of the STI trenches 18 can be removed by a chemical mechanical polishing (CMP) process as is known in the art such that no further explanation is required for a complete understanding of the present disclosure. A polysilicon recess can also be performed to recess the polysilicon material 22 to below the surface of at least the pad film 16. In this recess process, the pad film 16 acts as a mask to protect the underlying materials.

FIG. 4 shows an oxide material 24 over the polysilicon material 22 forming STI structures 18a, 18b. In embodiments, the oxide material 24 can be formed by an oxidation process, e.g., thermal oxidation which, in combination with the oxide liner 20, can fully encapsulate the polysilicon material 22 within the STI trenches to form the STI structures 18a, 18b. That is, the oxide material 24 and the oxide liner 20 lines all surfaces of the polysilicon material 22. The oxide material 24 can be above a top surface of the substrate 12, and be robust enough, e.g., of such dimensions and coverage, to survive removal of the pad films 14, 16 and subsequent device fabrication processes, e.g., fabrication of FETs. By way of illustrative example, the thickness of the oxide material 24 can be more than about 50 nm; although other dimensions are contemplated herein.

FIG. 5 shows devices formed on the substrate, amongst other features, and respective fabrication process. In particular, active devices 26 are formed on sides of the filled and encapsulated STI structures 18a; whereas, a passive device 28 can be formed over a filled and encapsulated STI structure 18b. The active devices 26 can be banks of transistors 50 and the passive device 28 can be a resistor, as examples. The polysilicon material 22 under the passive devices 28 can act as a shallow trench isolation structure providing thermal ballast, e.g., thermal coupling, between the resistor and the substrate 12.

Prior to forming of the active devices 26 and passive devices 28, the pad films 14, 16 can be removed by conventional etching or CMP processes. Thereafter, the active devices 26 and passive devices 28 can be formed by conventional CMOS process. By way of example, the active devices 26 can be formed using conventional gate formation processes, e.g., gate first processes or replacement gate processes. Illustratively and as a non-limiting example, in the gate first process, a gate dielectric material 26a and polysilicon material 26b are deposited and patterned using conventional CMOS fabrication process as is known in the art such that no further explanation is required for a complete understanding of the present disclosure. The gate dielectric material 26a can be an oxide material or a high-k gate dielectric material, e.g., $HfO_2$. A sidewall material 26c, e.g., nitride, can be formed on the patterned gate dielectric material 26a and polysilicon material 26b using conventional deposition processes followed by an anisotropic etching process. The passive devices 28 can be fabricated using the polysilicon material 26b and the sidewall material 26c. Source and drain regions 28d are formed on sides of the active devices 26 using conventional ion implantation processes or, alternatively, by doped epitaxial processes to form raised source and drain regions.

Still referring to FIG. 5, silicide contacts 30 are formed on the active devices 26, e.g., source and drain regions 26d and polysilicon material 26b. As should be understood by those of skill in the art, the silicide process begins with deposition of a thin transition metal layer, e.g., nickel, cobalt or titanium, over fully formed and patterned devices. After deposition of the material, the structure can be heated allowing the transition metal to react with exposed silicon (or other semiconductor material as described herein) in the active regions of the semiconductor device (e.g., source and drain region 26d and polysilicon material 26b) forming a low-resistance transition metal silicide contacts 30. Following the reaction, any remaining transition metal can be removed by chemical etching, leaving silicide contacts in the active regions of the device.

In FIG. 6, a masking material 32 can be formed over the devices 26, 28, followed by an etching process to form openings 34 that expose the polysilicon material 22 in selected STI structures 18a. In embodiments, the etching process forms openings in the oxide material 24 to expose the underlying polysilicon material 22. The etching process can be performed by conventional lithography and etching processes known in the art and as already described herein. As further shown, a different number of openings 34 can be provided for each of the different STI structures 18a, depending on the dimensions of the initial STI trenches. For example, multiple openings 34 can be provided in larger STI trenches, thereby allowing easier and/or faster venting (e.g., removal) of the polysilicon material in subsequent etching processes.

Figure 7:
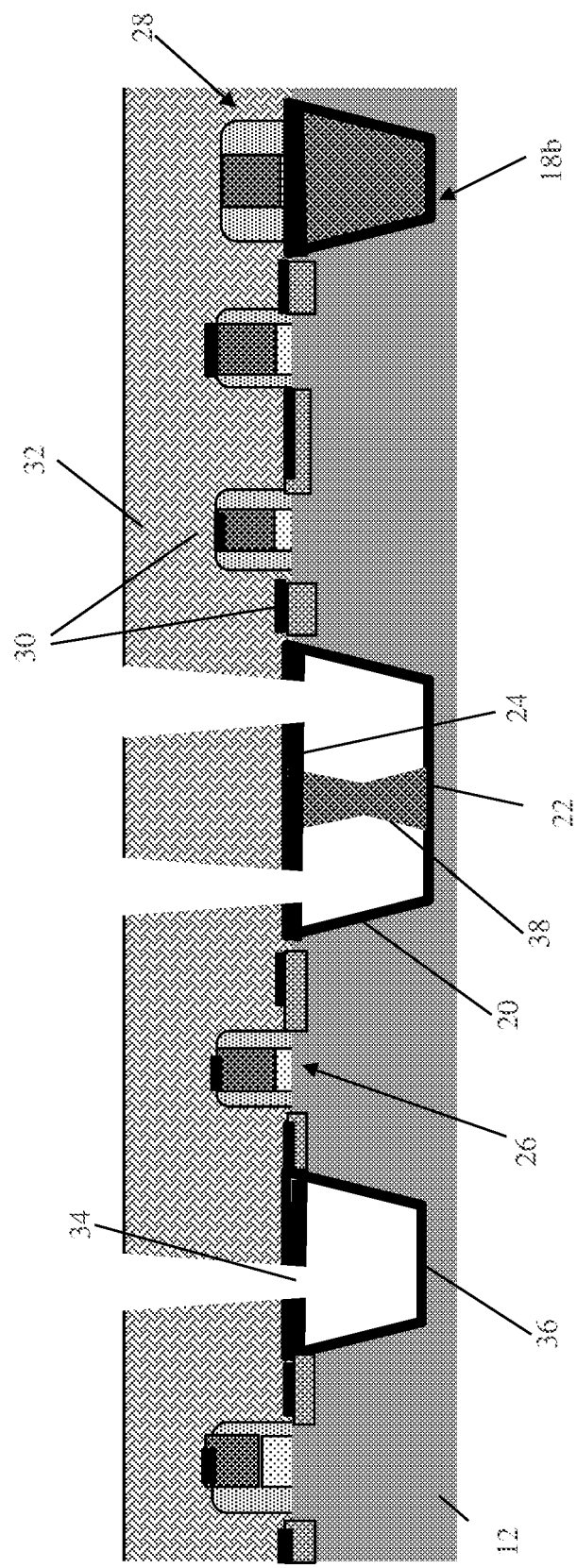
FIG. 7 shows trenches selected STI structures with material removed, amongst other features, and respective fabrication processes in accordance with aspects of the present disclosure.

As further shown in FIG. 7, the polysilicon material 22 can be removed from the STI structures to form an airgap 36. The oxide material 24 and the oxide liner 20 lines or remains on all surfaces of the airgap 36. The polysilicon material 22 can be removed through the openings 34 using dry chemistries, e.g., $XeF_2$ or wet chemistries, e.g., TMAH. In embodiments, the oxide liner 20 can be robust enough to protect erosion of the underlying material of the substrate 12 during the removal of the polysilicon material 22 with the dry or wet chemistries. The masking material 32 can be removed after the removal of the polysilicon material 22 from within the STI structures (structures 18a).

In embodiments, some polysilicon material 22 can remain in the larger STI trenches to form pillar structures 38. The pillar structures 38 provide support for the airgaps so that they do not collapse. It should be understood by those of skill in the art, that the pillar structures 38 may be a 'hourglass" shape, e.g.,)(, due to the of the isotropic nature of the $XeF_2$ etch chemistries; however, other shapes are also contemplated herein depending on the dimensions of the cavity, itself, the etch chemistries and time of the etch as a few variables.

Figure 8:
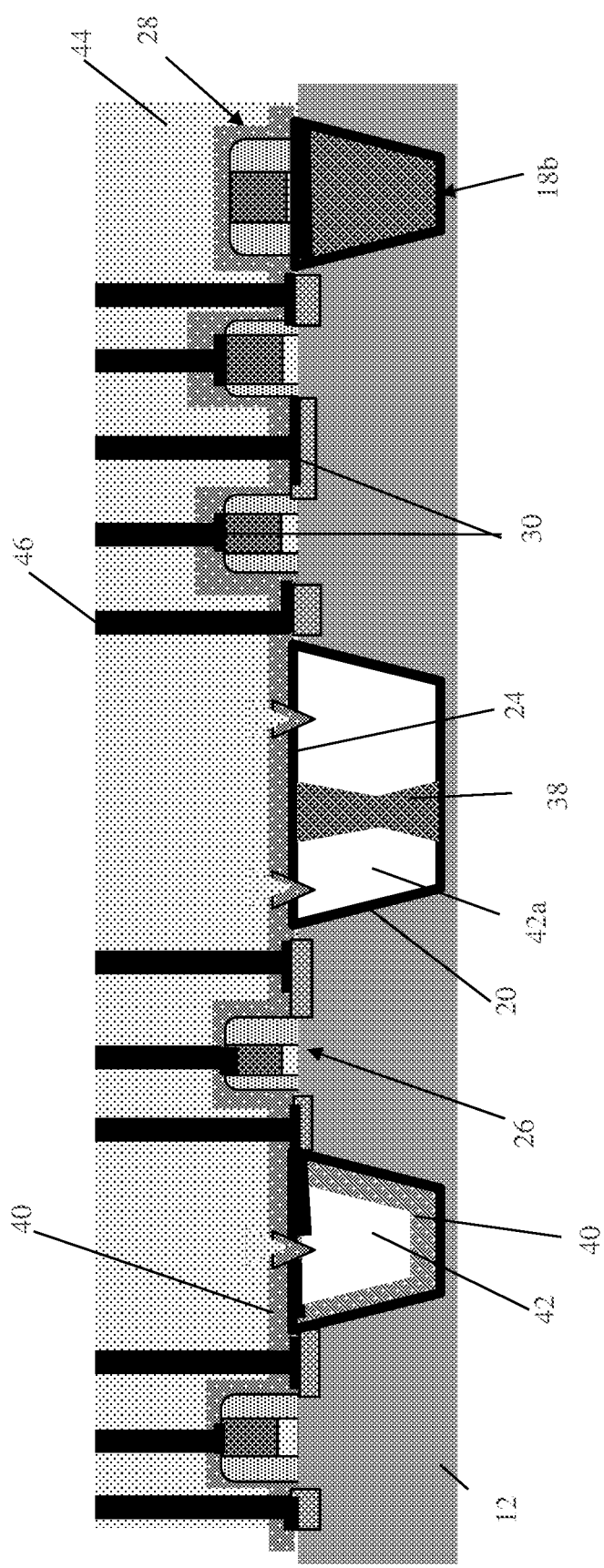
FIG. 8 shows airgap isolation structures, amongst other features, and respective fabrication processes in accordance with aspects of the present disclosure.

In FIG. 8, a barrier material 40 can be formed, e.g., deposited, on the structure, e.g., openings 34 of the oxide material 24 and devices 26, 28, by conventional deposition methods, e.g., plasma enhanced CVD processes, to a thickness which ensures pinch-off of the openings 34. In embodiments, the barrier material 40 seals the airgap, forming airgap isolation structures 42, 42a with different aspect ratios, e.g., with different dimensions. In further embodiments, during the pinch-off process to seal the airgap isolation structures 42, 42a, it is also contemplated that the barrier material 40 can line the airgap isolation structures 42, 42a, over the oxide material 20 as shown representative in airgap 42. The barrier material 40 can also be deposited directly on the oxide material 24 over the airgap isolation structures 42, 42a. The barrier material 40 also can be over the active devices 26 and passive devices 28 to provide protection during subsequent processing steps.

In embodiments, the different dimensions of the airgap isolation structures 42, 42a are possible due to the fact that there is no longer a constraint on aspect ratio for pinch-off, in addition to the use of STI structures. As previously noted, the original STI trenches 18 do not need to have the same aspect ratio as they are formed with other STI structures in the STI regions, compared to conventional airgap formation processes which all need to be the same aspect ratio. The smaller airgap isolation structure(s) 42 can be placed between transistors 26 in a single bank 50; whereas, the larger airgap isolation structure 42a can be placed between the separate banks 50, themselves.

An interlevel dielectric material 44 can be deposited over the devices, with contacts 46 formed to the silicide contacts of the, e.g., source/drain regions 26d and polysilicon material 26b. The interlevel dielectric material 44 can be BPSG material or other known interlevel dielectric material, e.g., $SiO_2$. The contacts 46 can be metal or metal alloy material, preferably composed of tungsten. The contacts 46 can be formed by conventional lithography and etching processes through the interlevel dielectric material 44 to form trenches, followed by deposition of conductive material within the trenches. Any residual material on the interlevel dielectric material 44 can be removed by a CMP process.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
a bulk substrate material;
a first airgap isolation structure in the bulk substrate material and comprising a first aspect ratio and an opening at an upper surface of the bulk substrate material;
a second airgap isolation structure in the bulk substrate material and comprising a second aspect ratio different from the first aspect ratio and an opening at the upper surface of the bulk substrate material; and a barrier material over the upper surface of the bulk substrate material and sealing the openings at the upper surface of the first airgap isolation structure and the second airgap isolation structure.

2. The structure of claim 1, wherein the first airgap isolation structure and the second airgap isolation structure comprise an oxide material lining on all surfaces.

3. The structure of claim 2, wherein the barrier material comprises a nitride material that extends on the oxide material over the first airgap isolation structure and the second airgap isolation structure and further extends over gate structures formed on the bulk substrate material.

4. The structure of claim 1, wherein the first airgap isolation structure and the second airgap isolation structure are on a same level as a shallow trench isolation structure.

5. The structure of claim 4, wherein the shallow trench isolation structure comprises a trench lined with oxide material and filled with polysilicon material over the oxide material, the oxide material further located on all surfaces of the first airgap isolation structure and the second airgap isolation structure.

6. The structure of claim 4, further comprising a passive device over the shallow trench isolation structure.

7. The structure of claim 1, wherein the second airgap isolation structure has more openings than the first airgap isolation structure.

8. The structure of claim 1, wherein the first airgap isolation structure comprises a plurality of airgap isolation structures which separate active devices in a single bank of active devices and the second airgap isolation structure separates banks of the active devices.

9. The structure of claim 1, wherein the first airgap isolation structure and the second airgap isolation structure are on sides to active devices, and the second airgap isolation structure is larger than the first airgap isolation structure.

10. The structure of claim 1, wherein the first airgap isolation structure and the second airgap isolation structure comprise an oxide material on an upper surface of the first airgap isolation structure and the second airgap isolation structure, with a second insulator material plugging at least one opening in the oxide material and is in direct contact with the oxide material over the bulk substrate material.

11. A structure comprising:
a bulk substrate material;
at least one airgap isolation structure in the bulk substrate material;
a first insulator material on all surfaces of the at least one airgap isolation structure; and
a second insulator material plugging at least one opening in the first insulator material and sealing the at least one airgap isolation structure, the second insulator material extending over an upper surface of the bulk substrate.

12. The structure of claim 11, wherein the first insulator material comprises an oxide material and the second insulator material comprises a nitride material that extends over and is direct contact with the oxide material on an upper surface of the at least one airgap isolation structure and above the bulk substrate material.

13. The structure of claim 11, wherein the at least one airgap isolation structure is on a same level as a shallow trench isolation structure, the shallow trench isolation structure comprises a lining of the first insulator material and filled with a polysilicon material on the first insulator material.

14. The structure of claim 13, wherein the at least one airgap isolation structure separates active devices of a single bank of active devices and a passive device is over the shallow trench isolation structure.

15. The structure of claim 11, wherein the at least one airgap isolation structure includes plural airgap isolation structures with various aspect ratios.

16. The structure of claim 15, wherein the plural airgap isolation structures comprise a first airgap structure of a first dimension and a second airgap structure of a second dimension, greater than the first dimension, the second airgap structure also includes a pillar structure composed of polysilicon material.

17. The structure of claim 16, wherein the second airgap isolation structure has more openings than the first airgap isolation structure, and each of the openings of the first insulator material are plugged with the second insulator material.

18. The structure of claim 16, wherein the first airgap isolation structure and the second airgap isolation structure are on a side of active devices.

19. A method comprising:
forming at least one airgap isolation structure in a bulk substrate material;
forming a first insulator material on all surfaces of the at least one airgap isolation structure; and
forming a second insulator material plugging at least one opening in the first insulator material and sealing the at least one airgap isolation structure, the second insulator material extending over an upper surface of the bulk substrate.

20. The method of claim 19, wherein the first insulator material comprises an oxide material and the second insulator material comprises a nitride material that extends over the oxide material on an upper surface of the at least one airgap isolation structure.

* * * * *